United States Patent [19]

Caudel

[11] 4,349,894

[45] * Sep. 14, 1982

[54] SEMICONDUCTOR MEMORY CELL WITH SYNTHESIZED LOAD RESISTORS

[75] Inventor: Edward R. Caudel, Houston, Tex.

[73] Assignee: Texas Instruments Incorporated, Dallas, Tex.

[*] Notice: The portion of the term of this patent subsequent to Nov. 25, 1997, has been disclaimed.

[21] Appl. No.: 210,079

[22] Filed: Nov. 24, 1980

Related U.S. Application Data

[62] Division of Ser. No. 925,891, Jul. 19, 1978, Pat. No. 4,236,229.

[51] Int. Cl.$^3$ .............................................. G11C 11/40
[52] U.S. Cl. .................................. 365/154; 307/279; 365/190
[58] Field of Search ............... 365/154, 190, 205, 222; 307/279, 291

[56] References Cited

U.S. PATENT DOCUMENTS

| | | | |
|---|---|---|---|
| 3,550,097 | 12/1970 | Reed | 365/190 |
| 4,103,185 | 7/1978 | Denes | 307/279 |
| 4,209,851 | 6/1980 | Ponder | 365/190 |
| 4,236,229 | 11/1980 | Caudel | 365/154 |

FOREIGN PATENT DOCUMENTS 1011457  5/1977  Canada ............................. 307/279

OTHER PUBLICATIONS

Miller, COS/MOS Random Access Memories, IEEE Digest, 3/71, pp. 34-35.

*Primary Examiner*—Stuart N. Hecker
*Attorney, Agent, or Firm*—John G. Graham

[57] ABSTRACT

An MOS memory cell of the static type employs a pair of cross-coupled driver transistors forming a bistable circuit, with load resistors replaced by a pair of series coupling transistors connecting storage nodes to complementary precharged data lines. A two phase clock turns on the coupling transistors in sequence, for refresh, so an intermediate node is charged during a first phase and discharged into the storage nodes during the second phase. Both transistors are turned on at the same time for read or write operations.

10 Claims, 9 Drawing Figures

SEMICONDUCTOR MEMORY CELL WITH SYNTHESIZED LOAD RESISTORS

This is a division of application Ser. No. 925,891, filed July 19, 1978, now U.S. Pat. No. 4,236,229.

RELATED CASES

The subject matter of this application is related to that disclosed in Ser. No. 925,892 (now U.S. Pat. No. 4,198,695), Ser. No. 925,893 (now U.S. Pat. No. 4,209,951), and Ser. No. 925,916 (now U.S. Pat. No. 4,184,208) with parent application Ser. No. 925,891 on July 19, 1978 and assigned to Texas Instruments.

BACKGROUND OF THE INVENTION

This invention relates to semiconductor memory devices, and more particularly to an improved static type, random access, read/write memory.

For use as memory in small minicomputers and microprocessor sysems, static semiconductor memory has an advantage compared to dynamic memory in that static does not require refresh. Dynamic MOS RAMs employ one-transistor cells compared to six transistor cells in conventional static RAMs, so the dynamic devices are much lower in cost because higher densities are achieved on smaller bar sizes. Unfortunately, the storage capacitors in dynamic cells leak charge and the data must be periodically refreshed by addressing each row of a memory array. In large memory systems, the circuitry required for refresh is small in proportion, but in the small memory associated with microcomputers, particularly on-chip registers, the refresh control circuitry is a significant portion of the system cost, so static type RAM cells must be used. Previous attempts to reduce the cell size in pseudo static or self refresh cells to make them more suitable for microcomputer devices include the following patents or applications, all assigned to Texas Instruments:

U.S. Pat. No. 3,955,181 issued to Joseph H. Raymond, Jr.,
Ser. No. 691,252, filed May 28, 1976 by G. R. Mohan Rao, now U.S. Pat. No. 4,246,692
U.S. Pat. No. 4,110,776 to Rao et al.,
U.S. Pat. No. 4,142,111 to David J. McElroy, It is a principal object of this invention to provide improved memory devices made in a semiconductor integrated circuits. Another object is to provide an improved "static" or non-refresh type MOS memory device, particularly a memory device of small cell size. An additional object is to provide small area pseudo static or non-refresh memory elements in semiconductor integrated circuits which may be incorporated into microcomputer devices.

SUMMARY OF THE INVENTION

In accordance with an embodiment of this invention, an MOS memory cell of the static type employs a pair of cross-coupled driver transistors forming a bistable circuit, with load resistors replaced by a pair of series coupling transistors connecting storage nodes to complementary precharged data lines. A two phase clock turns on the coupling transistors in sequence, for refresh, so an intermediate node is charged during a first phase and discharged into the storage nodes during the second phase. Both transistors are turned on at the same time for read or write operations.

BRIEF DESCRIPTION OF THE DRAWINGS

The novel features believed characteristic of the invention are set forth in the appended claims; the invention itself, however, as well as other features and advantages thereof, will best be understood by reference to the following detailed description of a particular embodiment, read in conjunction with the accompanying drawings, wherein:

DETAILED DESCRIPTION OF SPECIFIC EMBODIMENT

Figure 1:
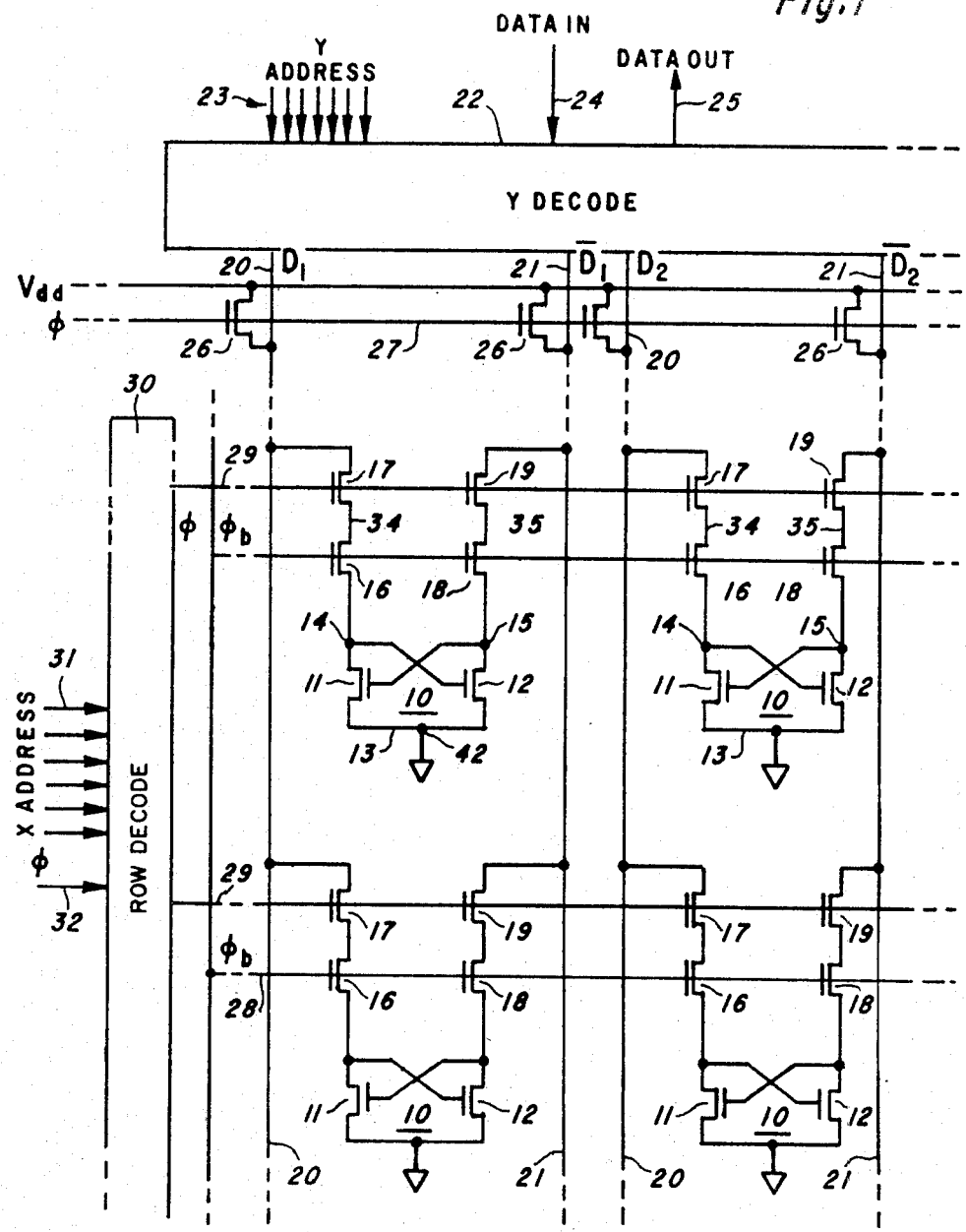
FIG. 1 is an electrical schematic diagram of an array of memory cells according to the invention.
Figure 2:
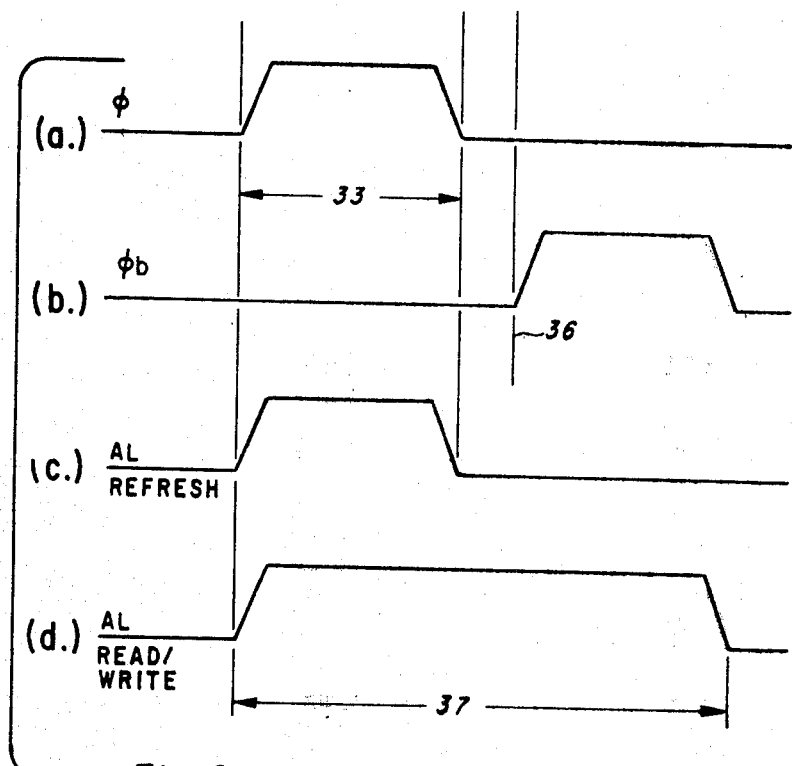
FIGS. 2a–2d are graphic representations of voltage vs. time for the voltage appearing at various points in the cell array of FIG. 1.

Referring to FIG. 1, there is shown a part of an array of memory cells 10 constructed according to the invention. Each cell 10 includes a pair of driver transistors 11 and 12 which have a common source region 13 connected to ground or Vss. The drain 14 or 15 of each of the driver transistors is connected to the gate of the opposite transistor, providing a cross coupled bistable circuit. No load resistors of the conventional type are used. A pair of series transistors 16 and 17 connect the drain 14 of the driver transistor 11 to a data line and likewise a pair of series transistors 18 and 19 connect the drain 15 of the driver transistor 12 to the data bar line in each cell 10 in each column. The pairs of data and data bar lines 20 and 21 are connected to a Y decoder 22 which selects one column or one of the pairs in accordance with a Y address applied to the inputs 23. One of the D or $\overline{\text{D}}$ lines 20 or 21 will go high and the other low, in the selected pair, according to whether a 1 or a 0 is applied to an input 24 for write operations. For read, a binary 1 or 0 is applied to the data out line 25 depending upon which one of the selected D or $\overline{\text{D}}$ lines 20 or 21 goes high. The data and data bar lines 20 and 21 are all precharged to Vdd through transistors 26 by a clock $\phi$ on line 27 as seen in FIG. 2a. The transistors 16 and 18 in each cell have a $\phi b$ clock applied to the gates by lines 28, $\phi b$ being shown in FIG. 2b. The other series transistors 17 and 19 have gates connected to row address lines 29 labeled AL1, AL2, etc. For a 64×64 array, for example, there would be sixty-four of the row lines 29 and sixty four pairs of the column or data lines 20 and 21. The voltage applied to all row lines 29 for refresh is shown in FIG. 2c, and that applied to the selected row for read-write is seen in FIG. 2d. One of the row lines 29 is selected for read-write by a row decoder 30 based on a row address applied to inputs 31, and to this line is applied the voltage of FIG. 2d; all other row lines 29 receive the voltage of FIG. 2b from a $\phi$ input 32 as in refresh operation.

An important feature of the invention is that there is no static current flow in either driver transistor. The data and data bar lines 20 and 21 are precharged to Vdd during a time period 33 during each operating cycle when $\phi$ is high. At this same time, all of the transistors 17 and 19 are on due to the AL clock (whether refresh or read-write), so the nodes 34 and 35 between the two series transistors charge to Vdd. For refresh, all of the transistors 17 and 19 then turn off as AL goes low, and Vdd is decoupled from the lines 20 and 21 by the transistors 26 as φ goes low, so the nodes 34 and 35 are isolated. Then φb goes high at time 36 and charge is supplied to the drains 14 and 15; one side will disipate this charge to ground through the conducting one of the driver transistors 11 or 12 in each cell 10, while the other will store the charge on the gate of the driver transistor. This maintains the stored one or zero until the next refresh cycle. In read or write operations, the one selected row line 39 will have a positive voltage on it for the entire time period 37 of FIG. 2d. This will maintain the transistors 17 and 19 turned on, so when φb turns on the transistors 16 and 18 at time 36 the storage nodes or drains 14 and 15 will be connected to the D and $\overline{D}$ lines 20 and 21 through the series transistors 16 and 17 or 18 and 19. For write, one line 20 or 21 for the selected column will be high and the other low, so this same condition will be applied to the gates of the transistors 20 and 21, driving one into conduction and turning off the other while storing a positive voltage on the gate of the on transistor while φb is high. When φb goes low, the source condition will be stored. For read, the precharged D and $\overline{D}$ lines 20 and 21 will be conditionally discharged beginning at times 36 when φb is high, holding transistors 16 and 18 on, and line 29 is high, holding the transistors 17 and 19 on for the selected row. During read or write operations, all cells except the selected one execute a refresh.

Figure 3:
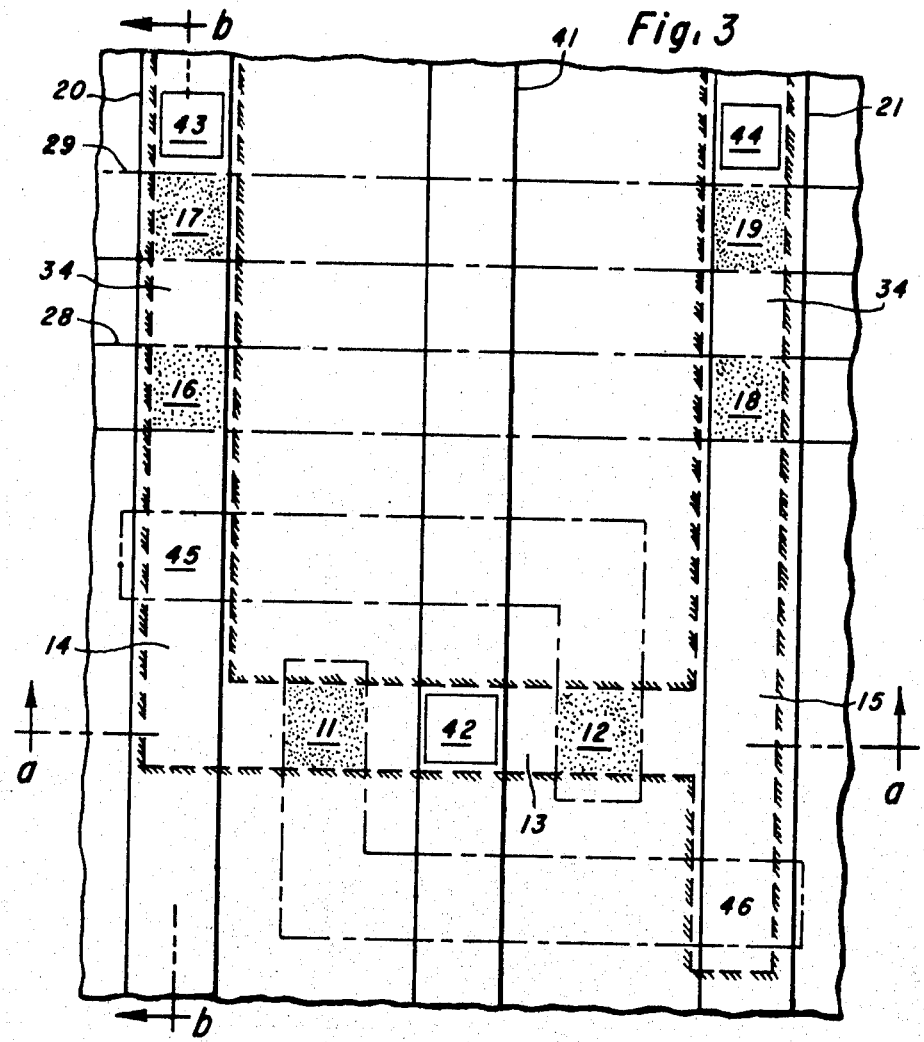
FIG. 3 is a greatly enlarged plan view of a small portion of a semiconductor chip showing the physical layout of a static memory cell made according to the embodiment of the invention of FIG. 1.
Figure 4A:
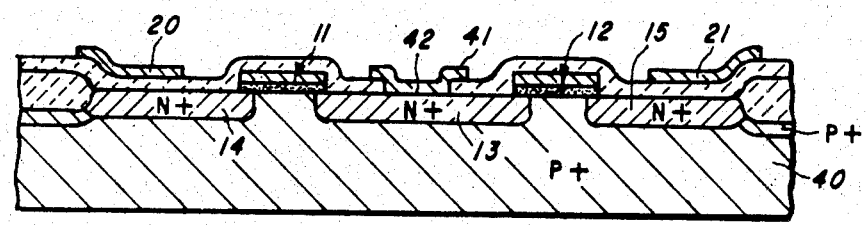
FIGS. 4a–4b are elevation views in section of the cell of FIG. 1, taken along the lines a—a and b—b, respectively.
Figure 4B:
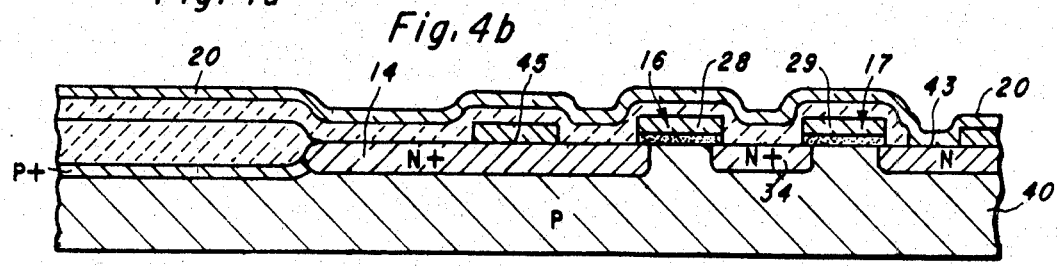

A cell layout for one embodiment of the static RAM of the invention is seen in FIG. 3. An N-channel silicon gate structure is shown wherein the transistors 11, 12 and 16-19 are formed in a part of a silicon bar 40. Only a very small portion of the bar is shown, perhaps 1½×2 mils; the remainder of the bar would contain the other cells of the array as well as the decoders and various other functions such as arithmetic unit, ROM control circuitry, input/output buffers, and the like, depending upon the desired functions. The connection to the common source regions 13 is made by a metal strip 41 and a metal-to-moat contact 42. The D and $\overline{D}$ lines 20 and 21 are also metal lines which are connected to the drains of the transistors 17 and 19 by metal-to-moat contacts 43 and 44. Polycrystalline silicon strips form the lines 28 and 29 as well as the gates of the transistors 16-19.

While this invention has been described with reference to an illustrative embodiment, this description is not intended to be construed in a limiting sense. Various modifications of the illustrative embodiment, as well as other embodiments of the invention, will be apparent to persons skilled in the art upon reference to this description. It is therefore contemplated that the appended claims will cover any such modifications or embodiments as fall within the true scope of the invention.

What is claimed is:

1. A semiconductor integrated circuit device formed in a face of a body of semiconductor material as a static self-refresh memory comprising: an array of rows and columns of memory cells formed at said face wherein each cell includes a pair of driver transistors and first and second pairs of coupling transistors of the same channel conductivity type, each of the transistors having a current path between source and drain regions in said face and a control electrode formed over said current path; a pair of storage nodes formed in said face by said regions with no d.c. path via said storage nodes and driver transistors between terminals of a voltage supply; a pair of complementary data lins for each column, the data lines being in the form of elongated conductors in said face and defining column lines; each pair of coupling transistors for each cell in each column having their current paths in said face connected separately in series between one of the data lines and one of the storage nodes; means in the device for precharging the pairs of data lines in all columns during a first time period; a plurality of first conductive means extending along said face and defining first row lines for applying operating voltage to the control electrodes of a first of the transistors in each of the pairs of coupling transistors separately for each row during said first time period; and a plurality of second conductive means extending along said face and defining second row lines for applying operating voltage to the control electrodes of the other of the transistors in each of the pairs of coupling transistors separately for each row during a second time period after said first time period in each read/write operating cycle or refresh cycle; the first conductive means applying operating voltage to the control electrodes of said first of the transistors during said second time period only during a read/write operating cycle and not during a refresh cycle, the first and second conductive means being a pair of adjacent parallel strips on said face perpendicular to said data lines and forming the control electrodes for all of the coupling transistors in a row; said voltage supply being applied to the memory cells via said data lines and a conductive line extending along said face parallel to and between said data lines and contacting ends of the source-to-drain paths of the driver transistors.

2. A device according to claim 1 wherein the first of the coupling transistors in each pair has its current path adjacent the data line and the other of the coupling transistors in each pair has its current path adjacent the storage node.

3. A device according to claim 2 wherein a node between the current path of the coupling transistors in each pair is charged during the first time period.

4. A device according to claim 2 wherein the first conductive strip applies an operating voltage to the control electrodes of said first of the coupling transistors during said second time period for read or write operations.

5. A device according to claim 4 wherein said transistors are insulated gate field effect transistors, the current paths are source-to-drain paths, and the control electrodes are gates.

6. A device according to claim 5 wherein the drain of each of the driver transistors is connected to the gate of the other to provide a cross coupled bistable circuit.

7. A device according to claim 6 wherein a plurality of identical cells is provided in an array of rows and columns.

8. A device according to claim 7 wherein the first conductive strip provides a row address line for a plurality of cells in a row.

9. A device according to claim 8 wherein a plurality of pairs of said data lines provide the column lines for the array of cells.

10. A device according to claim 9 wherein means are provided for selecting one row and one column for read or write operations, and all other cells are refreshed during an operating cycle.

* * * * *